United States Patent [19]

Valdenaire

[11] Patent Number: 5,059,978
[45] Date of Patent: Oct. 22, 1991

[54] RESISTOR-STRING DIGITAL TO ANALOG CONVERTERS WITH AUXILIARY COARSE LADDERS

[75] Inventor: Patrick Valdenaire, Golff-Juan, France

[73] Assignee: VLSI Technology, Inc., San Jose, Calif.

[21] Appl. No.: 631,602

[22] Filed: Dec. 20, 1990

[51] Int. Cl.[5] ............................................. H03M 1/68
[52] U.S. Cl. ................................. 341/145; 341/144
[58] Field of Search ............... 341/118, 144, 145, 155, 341/156, 159

[56] References Cited

U.S. PATENT DOCUMENTS

| | | | |
|---|---|---|---|
| 4,496,935 | 1/1985 | Inoue et al. | 341/159 |
| 4,543,560 | 9/1985 | Holloway | 341/145 |
| 4,896,157 | 1/1990 | Mijuskovic | 341/144 |
| 4,910,514 | 3/1990 | Irmer et al. | 341/64 |
| 4,924,225 | 5/1990 | Dingwall et al. | 341/118 |
| 4,990,917 | 2/1991 | Kohdaka | 341/159 |

Primary Examiner—A. D. Pellinen
Assistant Examiner—Marc S. Hoff
Attorney, Agent, or Firm—Bowles Horton

[57] ABSTRACT

A digital to analog converter for the conversion of a digital signal into a corresponding analog signal. The converter has a resistive string comprising a string of first resistive segments having between segments selectable nodes including intermediate nodes wherein consecutive intermediate nodes are separated by a respective plurality of said segments. Switches provide selective coupling of at least one of the selectable nodes to an output. A decoder is responsive to the digital signal for controlling the switches. In order to reduce the output impedance of the converter and to reduce variation in the output impedance with the position of the selected node at least one auxiliary string of second resistive segments is coupled in parallel with the resistive string, providing between intermediate nodes substantially lower impedance than the respective first segments.

5 Claims, 4 Drawing Sheets

5,059,978

RESISTOR-STRING DIGITAL TO ANALOG CONVERTERS WITH AUXILIARY COARSE LADDERS

FIELD OF THE INVENTION

The present invention relates to digital to analog converters and like devices which comprise a string of resistors defining a multiplicity of nodes and switch means for selectively coupling any of the nodes to provide an output which is a selectable fraction or segment of a signal applied to the resistive string. To provide digital to analog conversion, the switches are controlled by the bits of a digital signal so that for example a unique node or pair of nodes is coupled to provide the output dependent upon the particular value of the bits in the controlling digital signal.

The digital signal may be a complete digital word but may be part of a digital word if the converter is used as part of a segmented digital to analog converter.

BACKGROUND TO THE INVENTION

In order to convert, for example, an 8-bit digital signal to a corresponding analog signal one may employ a ladder or string of 256 resistors and control switches, which may be arranged in a two dimensional switching matrix, to couple any selected node of the string to an output. The string may be energized by a reference signal, for example a signal defined by two reference voltage sources. A converter or divider of this kind has considerable utility and has the advantage that monotonicity of the output is guaranteed. However, the usefulness of a resistive string converter is limited by the settling time required by the converter and also the variation of settling time with input code, that is to say the value of the bits controlling the switches coupled to the nodes of the string. The problem is particularly acute for converters realised using CMOS technology. The slow settling time is due mainly to the high output impedance of the converter. In a typical arrangement wherein an array of switches is employed to select a node for coupling to an output, the output impedance comprises two conductive switch resistances and the parallel impedance of the two sections of the string defined by that node. This parallel impedance is at its lowest when the selected node is at one end of the string and may be substantially zero for one end of the string and substantially the resistance of one resistive segment at the other end of the string. The corresponding nodes are associated with the highest and lowest possible codes (for example all zeros and all ones). For input codes which are intermediate the extreme ranges, the parallel impedance is very much higher. In particular, for a node at the middle of the resistor string, the parallel resistance is (for an eight bit converter) sixty-four times the resistance of one segment, because it is the effective impedance of two 128-resistor strings in parallel.

To improve the settling time of the converter, the value of the resistive segments ought to be decreased but it is not practical to obtain very low values of resistors generally in integrated circuit technology and particularly in CMOS technology.

Moreover a decrease in the value of the resistors makes matching of resistors more difficult and therefore adversely affects linearity and increases power dissipation.

It is accordingly the object of the invention to provide an improved resistive string converter.

A more particular object of the invention is to provide a resistive string converter which is associated with at least one and preferably two coarse ladders which are connected in parallel with the main resistive string and which accurately define voltage segments across the resistive string and shunt the high values of resistance for mid range selections.

Other objects and advantages of the invention will become apparent during the following description of a preferred embodiment with reference to the drawings.

DETAILED DESCRIPTION OF A PREFERRED EMBODIMENT

The invention will be particularly described in relation to an 8-bit digital to analog converter employing a resistive string composed of 256 resistive elements. These particular values are not essential to the present invention. Operation at 7-bits to 10-bits is also feasible. However, resistive strings are not currently practicable for conversion at a higher number of bits owing to the very large number of resistive elements required and there is less advantage to be gained by the present invention if the number of bits is significantly below eight.

Figure 1:
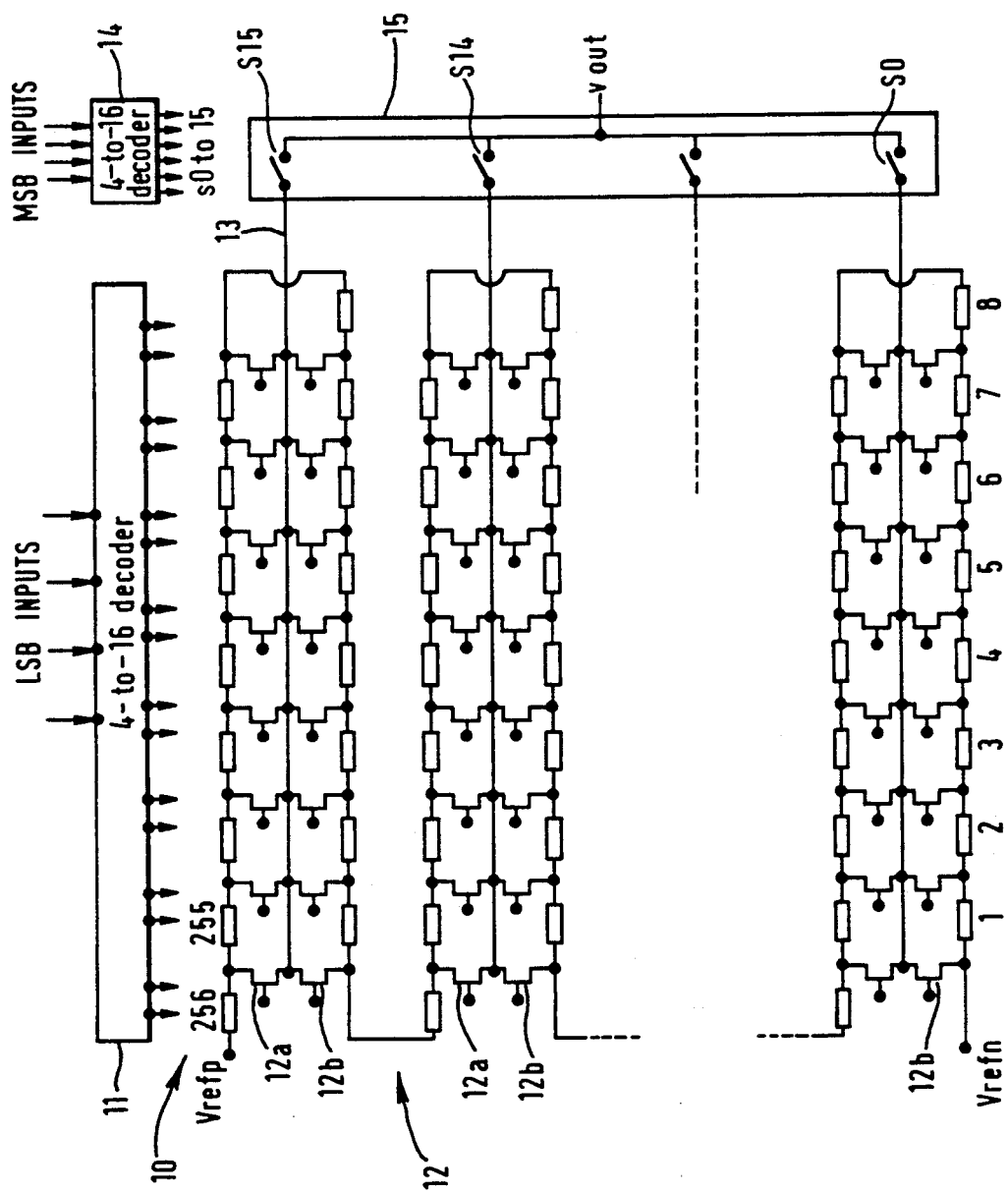
FIG. 1 illustrates a known form of resistive string converter.

FIG. 1 illustrates by way of example a string 10 of 256, preferably matched, resistors which may be connected to relatively positive reference source Vrefp at one end and a relatively negative voltage source Vrefn at the other. The resistive voltage string has a corresponding plurality of nodes, the most significant node being between resistors 256 and 255 and the least significant node being that between the first resistor and the negative voltage terminal Vrefn. Each of these nodes may be connected to provide an output voltage Vout by operation of an array of switches in accordance with an 8-bit input digital signal.

In the converter of FIG. 1 the switches are arranged in a two dimensional array, there being sixteen groups of sixteen switches 12 controlled by the four least significant bits of the digital signal by way of a 4-to-16 decoder 11. Each output of the decoder controls a respective switch in each of the groups 12. It will be seen that each group of switches is provided in respect of two legs of eight resistors in the string, which is in a folded form.

Associated with each pair of legs of the string is a respective one of a plurality of row lines 13. The appropriate row line is selected by one of the switches S0 to S15 in an array 15 in response to a respective one of the outputs of a 4-to-16 decoder 14 controlled by the four more significant bits of the input digital signal.

The manner of operation of a converter of the type shown in FIG. 1 is well known. For example, if the least significant bits are all 1s, the switch 12a coupled to the most significant node, as well as the corresponding switches 12a in each of the other sixteen groups is closed to couple the corresponding nodes each to one of the row lines 13. Selection of the desired row line is made in accordance with the state of the four most significant bits. Thus for example for a digital signal of all 1s, the switch S15 would be closed to couple the most significant node of the array 10 to the output terminal. If (again for example) the top four bits are 1110 (most significant bit first) and the bottom four bits are all 1s, then again the switch 12a in each group of switches is closed but this time the switch S14 is closed to couple the node between resistors 240 and 239 to the output terminal.

As a third illustration, if the 8-bit digital signal is composed of all zeros, then the switches 12b in each array are closed and the switch S0 is likewise closed so as to couple the least significant node (between Vrefn and the first resistor) to the output terminal.

As mentioned previously, a converter of the kind shown in FIG. 1, and other converters which may have different decoding arrangements but are still based upon a resistive string, have guaranteed monotonicity. However, a factor in the settling time is the output impedance of the converter. This output impedance normally comprises at least two conductive switch resistances (i.e. a switch in the array 12 and a switch in the array 15) and an impedance which is the parallel combination of those sections of the string which are defined by the selected node. If the least significant node is selected, then the parallel impedance is very low. If the most significant node is selected then the impedance is low because it comprises substantially one resistive segment in parallel with a resistance 255 times as great. For a node at the middle of the string, the parallel resistance is the parallel combination of two impedances each 128 times the resistance of one resistive segment.

Typically, a resistive segment has a resistance Rtab of 400 ohms. The conductive resistances of the switches in the two arrays may, for example, be assumed to be 1 kilohm and 500 ohms respectively. Thus the least output resistance of the converter will be 1.5 kilohms and the maximum resistance will be 25.6 kilohms greater than the minimum resistance. The very large output impedance for mid range values produces a long settling time and accordingly limits the operation of the digital to analog converter to low frequencies.

It is not practical to obtain resistor tab values below a few hundred ohms, when employing normal materials such as polysilicon, which has a sheet resistivity of between 20 and 30 ohms per square. Consequently the operating frequency of the converter is below a few tens of kiloHertz.

Typically for example if operation of a converter at 10 MHz were required, and there is a capacitative load of 10 picofarads due to the input of, for example, a following buffer amplifier and on the assumption that there is another 10 picofarad lumped capacitance due to the resistor ladder and stray capacitance associated with the switches, the resistance of each resistor in the string would have to be about 5 ohms, which is impracticably small. Even so the worst settling time would, again, be many times worse than the fastest settling time.

Figure 2:
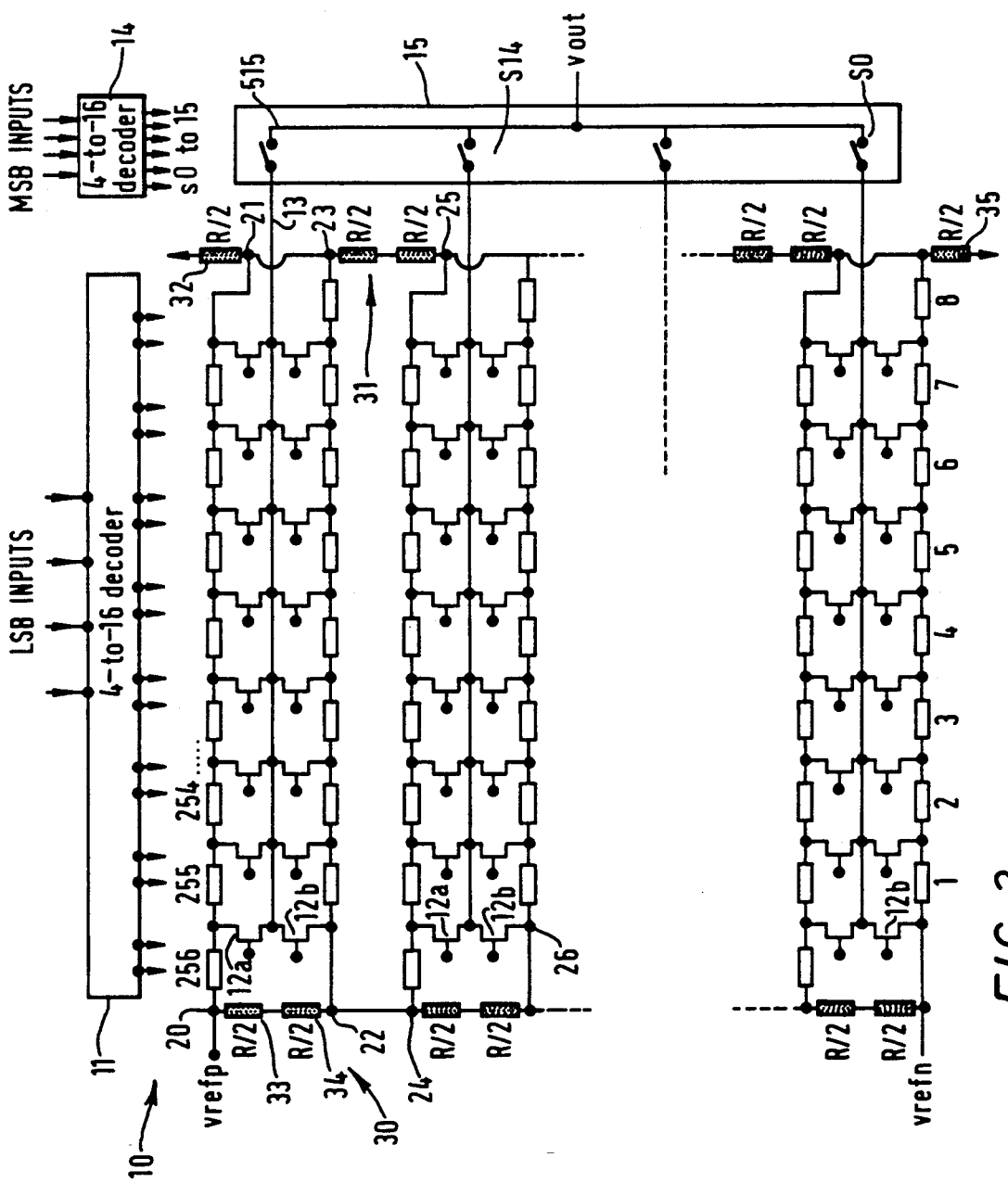
FIG. 2 illustrates for the sake of example a resistive string converter according to the invention.

FIG. 2 of the drawings illustrates a technique which reduces the absolute value of the output impedance and its variation and facilitates a reduction in settling time for an digital to analog converter.

The converter shown in FIG. 2 is shown as a modification of the converter as described with reference to FIG. 1 and accordingly its detailed operation will not be described again. It is emphasized that the present invention is applicable to other forms of digital to analog converter employing resistive strings, e.g. converters which provide a voltage segment by connection of consecutive nodes to respective outputs.

FIG. 2 differs from FIG. 1 by the incorporation of two strings of coarse resistors 30 and 31 each coupled across the reference potential and each dividing the voltage range into, in this example, sixteen equal segments. The ladder or string 30 is connected to a first node 20 of the string between Vrefn and the resistor 256, to the sixteenth node 22 and the thirty second node 23 etc. whereas the resistor string 31 is connected to the eighth node 21, the twenty-fourth node 23, and so on of the array. The string 31 divides the voltage range into segments corresponding to 0.5/16, 1.5/16 etc., whereas the string 30 divides the voltage range into segments corresponding to 1/16, 2/16 and so on.

The R/2 resistors 32 and 35 at each end of the string 31 are equal to half the resistance R (e.g. the sum of resistors 33 and 34) connected between alternate nodes.

The nodes to which the respective ladders are connected are accordingly alternate intermediate nodes, there being the same multiplicity, in this embodiment eight, of resistive segments of the fine ladder between each intermediate node.

Figure 3:
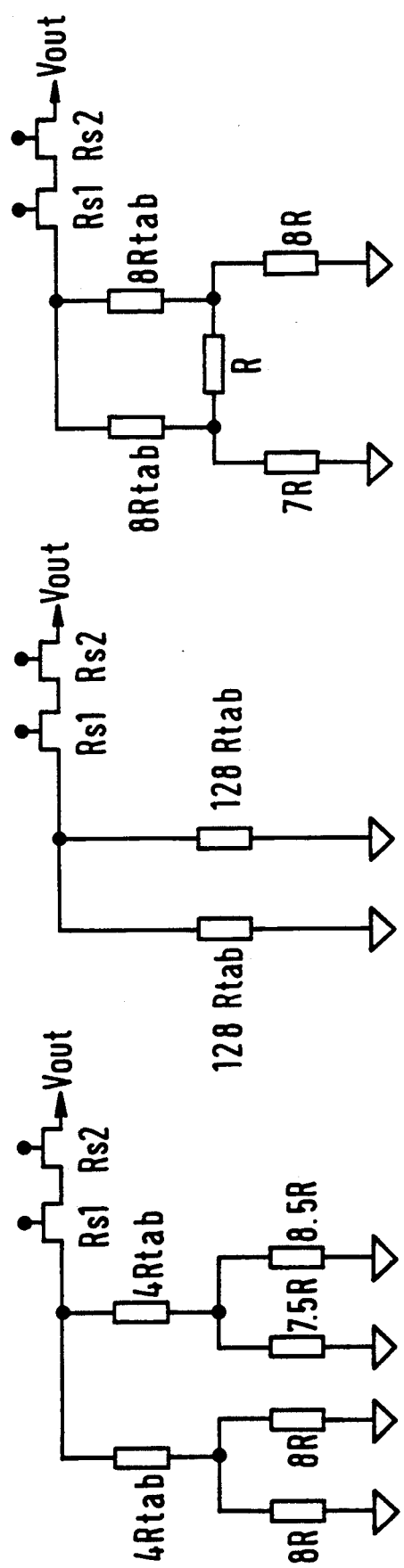
FIGS. 3A, 3B and 3C are explanatory diagrams illustrating the output impedance of the known converter and converters according to the invention.

The ladders or strings 30 and 31 define coarse voltage segments for the fine ladder but also provide shunting of the output impedance of the converter. The reduction in output impedance is negligible for extremes of the array but substantial for nodes near the middle of the array. FIG. 3B illustrates the output impedance for the worst possible case wherein the output impedance consists of the two switch resistors and the parallel combination of (1) four of the fine resistive segments in series with the parallel combination of two branches of eight coarse resistive segments and (2) four fine resistive segments in series with two legs one of 7.5 coarse segments and the other 8.5 coarse segments.

It will be seen that for any reasonable value of R (for example 1 kilohm) the worst case for Rout is very much less than the worst case in FIG. 3A.

For typical values, instead of the maximum output resistance being of the order of 26 kilohms, it can be reduced to about 4 kilohms.

Some improvement is obtainable even if the right hand ladder is employed and the left hand ladder is omitted. FIG. 3C illustrates the worst case for a single ladder. Here, the maximum impedance is about 7 kilohms.

The figures are based on a resistance of R=500 ohms for each of the coarse resistive segments.

Figure 4:
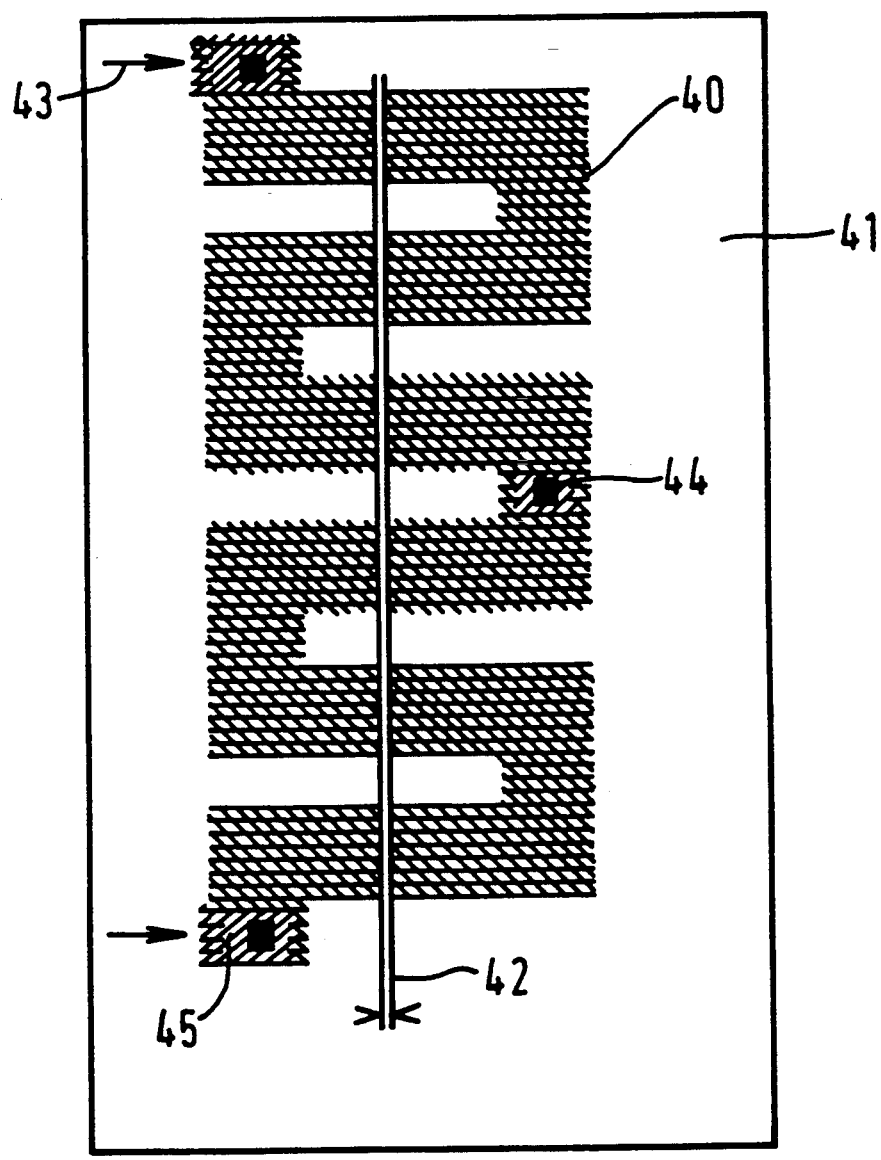
FIG. 4 is a drawing of one form of resistor.

In CMOS technology, all resistors are usually and easily made of polysilicon. Each coarse resistor 40 may be made as shown in FIG. 4 on a substrate 40. The resistor has a serpentine form extending between pads 43 and 45. A connection pad 44 is provided at the mid point of the resistor because the ladder 31 requires half-segments 32 and 35 at each end of the ladder. The serpentine shape facilitates scaling of the resistance value by simple extension in the 'horizontal' direction.

I claim:

1. A digital to analog converter for the conversion of a digital signal into a corresponding analog signal, comprising:

a resistive string comprising a string of first resistive segments, said string having selectable nodes between segments, said selectable nodes including intermediate nodes wherein consecutive intermediate nodes are separated by a respective plurality of said segments;

switch means for selectively coupling at least one of the selectable nodes to an output;

decoding means responsive to the digital signal for controlling the switches to couple the said at least one selectable node to the said output; and at least one auxiliary string of second resistive segments said second resistive segments of the auxiliary string providing between said intermediate nodes substantially lower impedance than the respective first segments, connected in parallel with the said resistive string and having nodes coupled to intermediate nodes of the said resistive string.

2. A digital to analog converter according to claim 1 wherein said one auxiliary string is connected to a first set of intermediate nodes and a second auxiliary string is connected to a second set of intermediate nodes, the said intermediate nodes of said first set alternating with the said intermediate nodes of said second set.

3. A digital to analog converter for the conversion of a digital signal into a corresponding analog signal, comprising:

a resistive string of first resistive segments, said string having selectable nodes between segments, said selectable nodes including intermediate nodes wherein consecutive intermediate nodes are separated by a respective plurality of said segments;

switch means for selectively coupling at least one of the selectable nodes nodes to an output, said switch means comprising a two dimensional switching matrix having a plurality of sets of switches wherein one switch in each set is operable to connect a respective selectable node to a respective one of a plurality of selector lines and a further set of switches for coupling a selcted selector line to an output;

decoding means responsive to the digital signal for controlling the switches to couple the said at least one node to the said output, the decoding means comprising means responsive to a first group of digits for controlling said plurality of sets of switches and means responsive to a second group of digits for controlling said further set of switches;

at least one auxiliary string of second resistive segments, said second resistive segments of the auxiliary string providing between said intermediate nodes substantially lower impedance than the respective first segments, connected in parallel with the said resistive string and having nodes coupled to intermediate nodes of the said resistive string.

4. A CMOS digital to analog converter for the conversion of a digital signal into a corresponding analog signal, comprising:

a resistive string comprising a string of first equal resistive segments, said string having selectable nodes between segments, said selectable nodes including intermediate nodes wherein consecutive intermediate nodes are separated by a respective plurality of said segments;

switch means for selectively coupling at least one of the selectable nodes to an output;

decoding means responsive to the digital signal for controlling the switches to couple the said at least one selectable node to the said output;

a first auxiliary string of second resistive segments, said second resistive segments of the first auxiliary string providing between first intermediate nodes substantially lower impedance than the respective first segments, connected in parallel with the said resistive string; and a second auxiliary string of second resistive segments, said second resistive segments of the second string providing between second intermediate nodes substantially lower impedance than the respective first segments, connected in parallel with said resistive string.

5. A digital to analog converter according to claim 4 wherein said first intermediate nodes alternate with said second intermediate nodes.

* * * * *